US011809158B2

United States Patent
Seo et al.

(10) Patent No.: US 11,809,158 B2
(45) Date of Patent: Nov. 7, 2023

(54) APPARATUS AND METHOD FOR TREATING SUBSTRATE BASED ON DEFECT VALUES OF TRANSFER PATHS

(71) Applicant: Semes Co., Ltd, Cheonan-si (KR)

(72) Inventors: Tae Woong Seo, Cheonan-si (KR); Taerim Lee, Cheonan-si (KR); Youngje Um, Busan (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 16/518,059

(22) Filed: Jul. 22, 2019

(65) Prior Publication Data

US 2020/0026258 A1 Jan. 23, 2020

(30) Foreign Application Priority Data

Jul. 23, 2018 (KR) ........................ 10-2018-0085170

(51) Int. Cl.
G05B 19/4065 (2006.01)
H01L 21/67 (2006.01)

(52) U.S. Cl.
CPC .... *G05B 19/4065* (2013.01); *H01L 21/67173* (2013.01); *H01L 21/67259* (2013.01); *G05B 2219/40006* (2013.01)

(58) Field of Classification Search
CPC ...... G05B 19/4065; G05B 2219/40006; H01L 21/67259; H01L 21/67173;
(Continued)

(56) References Cited

U.S. PATENT DOCUMENTS

2003/0054573 A1 3/2003 Tanaka et al.
2005/0037272 A1 2/2005 Tanaka
(Continued)

FOREIGN PATENT DOCUMENTS

CN 1646896 A 7/2005
CN 101764075 A 6/2010
(Continued)

OTHER PUBLICATIONS

Office Action for Korean Application No. 10-2018-0085170 dated Sep. 25, 2020.
(Continued)

*Primary Examiner* — Christopher E. Everett
*Assistant Examiner* — Tameem D Siddiquee
(74) *Attorney, Agent, or Firm* — HARNESS, DICKEY & PIERCE, P.L.C.

(57) ABSTRACT

A substrate treating apparatus includes a process module including a plurality of process units that perform a plurality of steps included in a substrate treating process and that perform the substrate treating process on substrates sequentially placed in the process units based on process recipes for the substrates, a scheduler that controls operations of the process module and the process units included in the process module, a storage that stores transfer paths information of the substrates, and a selection module that selects a process unit to proceed, by a result of feeding back the transfer paths information stored in the storage to the scheduler. The substrate treating apparatus may further include a measuring instrument that measures defect values of the transfer paths information along which the substrates are transferred. The storage may store the defect values measured by the measuring instrument according to the transfer paths information of the substrates.

9 Claims, 5 Drawing Sheets

(58) Field of Classification Search
CPC ......... H01L 21/67276; H01L 21/67288; H01L 21/67745; H01L 21/67167; H01L 21/67225

See application file for complete search history.

(56) References Cited

U.S. PATENT DOCUMENTS

| | | | |
|---|---|---|---|
| 2006/0262287 A1* | 11/2006 | Hiar | G03F 7/70875 355/72 |
| 2007/0134601 A1 | 6/2007 | Naitou et al. | |
| 2007/0156274 A1* | 7/2007 | Dierks | G05B 23/0251 700/108 |
| 2007/0219660 A1* | 9/2007 | Kaneko | H01L 21/67271 700/100 |
| 2010/0197051 A1* | 8/2010 | Schlezinger | H01L 31/188 438/16 |
| 2011/0076120 A1 | 3/2011 | Itou | |
| 2011/0172800 A1* | 7/2011 | Koizumi | H01L 21/67253 700/100 |
| 2015/0053336 A1* | 2/2015 | Lim | G06F 3/0443 156/247 |
| 2016/0147219 A1* | 5/2016 | Siddiqui | G05B 19/41865 700/101 |
| 2017/0200658 A1 | 7/2017 | Yang et al. | |
| 2017/0363969 A1* | 12/2017 | Hauptmann | G03F 7/70783 |
| 2018/0143144 A1* | 5/2018 | Mori | G01N 21/9501 |
| 2019/0086906 A1* | 3/2019 | Emani | H01L 21/67167 |

FOREIGN PATENT DOCUMENTS

| | | |
|---|---|---|
| CN | 105580123 A | 5/2016 |
| JP | 2001-351848 A | 12/2001 |
| JP | 5445006 B2 | 3/2014 |
| KR | 10-2011-0035912 A | 4/2011 |
| KR | 10-1541242 B1 | 8/2015 |
| KR | 10-20150100532 A | 9/2015 |
| KR | 10-2016-0063289 A | 6/2016 |
| KR | 10-20170113091 A | 10/2017 |
| KR | 10-2018-0005843 A | 1/2018 |

OTHER PUBLICATIONS

First Office Action dated Jan. 13, 2023 in Chinese Application No. 201910665823.9.

Notice of Allowance dated Jun. 8, 2023 in the Chinese Patent Application No. 201910665823.9.

* cited by examiner

APPARATUS AND METHOD FOR TREATING SUBSTRATE BASED ON DEFECT VALUES OF TRANSFER PATHS

CROSS-REFERENCE TO RELATED APPLICATIONS

A claim for priority under 35 U.S.C. § 119 is made to Korean Patent Application No. 10-2018-0085170 filed on Jul. 23, 2018, in the Korean Intellectual Property Office, the entire contents of which are hereby incorporated by reference.

BACKGROUND

Embodiments of the inventive concept described herein relate to an apparatus and method for treating a substrate.

A photolithography process of forming a desired pattern on a substrate is a key process of semiconductor manufacturing. In general, the photolithography process is performed in spinner equipment that is connected with exposing equipment in order to continuously perform a coating process, an exposing process, and a developing process. The spinner equipment includes a process module that sequentially or selectively performs a hexamethyldisilazane (HMDS) process, a coating process, a bake process, and a developing process.

The process module includes a plurality of process units such as a spin coater that coats a substrate with photoresist, a spin developer that performs a developing process on the substrate exposed to light, a baker that includes a heating plate and a cooling plate that heat and cool the substrate before or after the photoresist coating process or the developing process, and the like.

Steps of a flow recipe created for process operation are operated as specified. However, a scheduler determines which module is selected and which path is used to transfer a substrate, in consideration of various situations. In selecting a progress direction module and a feeding unit in the related art, a method of selecting and using the earliest accessed (that is, used) unit and module is used, thereby enabling all units to be equally used.

SUMMARY

Embodiments of the inventive concept provide a substrate treating apparatus and method for improving a process result by feeding back a path along which a wafer is transferred in the substrate treating apparatus including a plurality of process units.

Furthermore, embodiments of the inventive concept provide a substrate treating apparatus and method for automatically selecting an efficient process unit.

The technical problems to be solved by the inventive concept are not limited to the aforementioned problems. Any other technical problems not mentioned herein will be clearly understood from the following description by those skilled in the art to which the inventive concept pertains.

According to an exemplary embodiment, a substrate treating apparatus includes a process module including a plurality of process units that perform a plurality of steps included in a substrate treating process and that perform the substrate treating process on substrates sequentially placed in the process units based on process recipes for the substrates, a scheduler that controls operations of the process module and the process units included in the process module, storage that stores transfer paths of the substrates, and a selection module that selects a process unit to proceed, by feeding back a result stored in the storage to the scheduler.

The substrate treating apparatus may further include a measuring instrument that measures defect values of the transfer paths along which the substrates are transferred.

The storage may store the defect values measured by the measuring instrument according to the transfer paths of the substrates.

According to an embodiment of the inventive concept, the storage may simulate and store all paths along which the substrates are capable of proceeding and may store defect values measured according to all the paths simulated.

The selection module may apply weighting values to the process units included in the transfer paths of the substrates, based on the defect values stored in the storage.

The selection module may select a process unit having the highest priority, based on a result obtained by applying the weighting values.

According to an exemplary embodiment, a substrate treating method includes performing, by process units, a substrate treating process on substrates sequentially placed in the process units, based on process recipes for the substrates and controlling, by a scheduler, the substrate treating process. The scheduler selects a process unit in which a process is to be performed, by performing feedback based on a database in which transfer paths of the substrates are stored.

The substrate treating method may further include storing the transfer paths of the substrates and measuring defect values according to the transfer paths of the substrates by using a measuring instrument.

The substrate treating method may further include applying weighting values to the process units, based on the measured defect values and selecting a process unit having the highest priority among the process units to which the weighting values are applied.

The storing of the transfer paths of the substrates may include storing all paths along which the substrates are capable of proceeding.

The measuring of the defect values may include measuring the defect values by using the measuring instrument installed before and after the substrate treating process.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
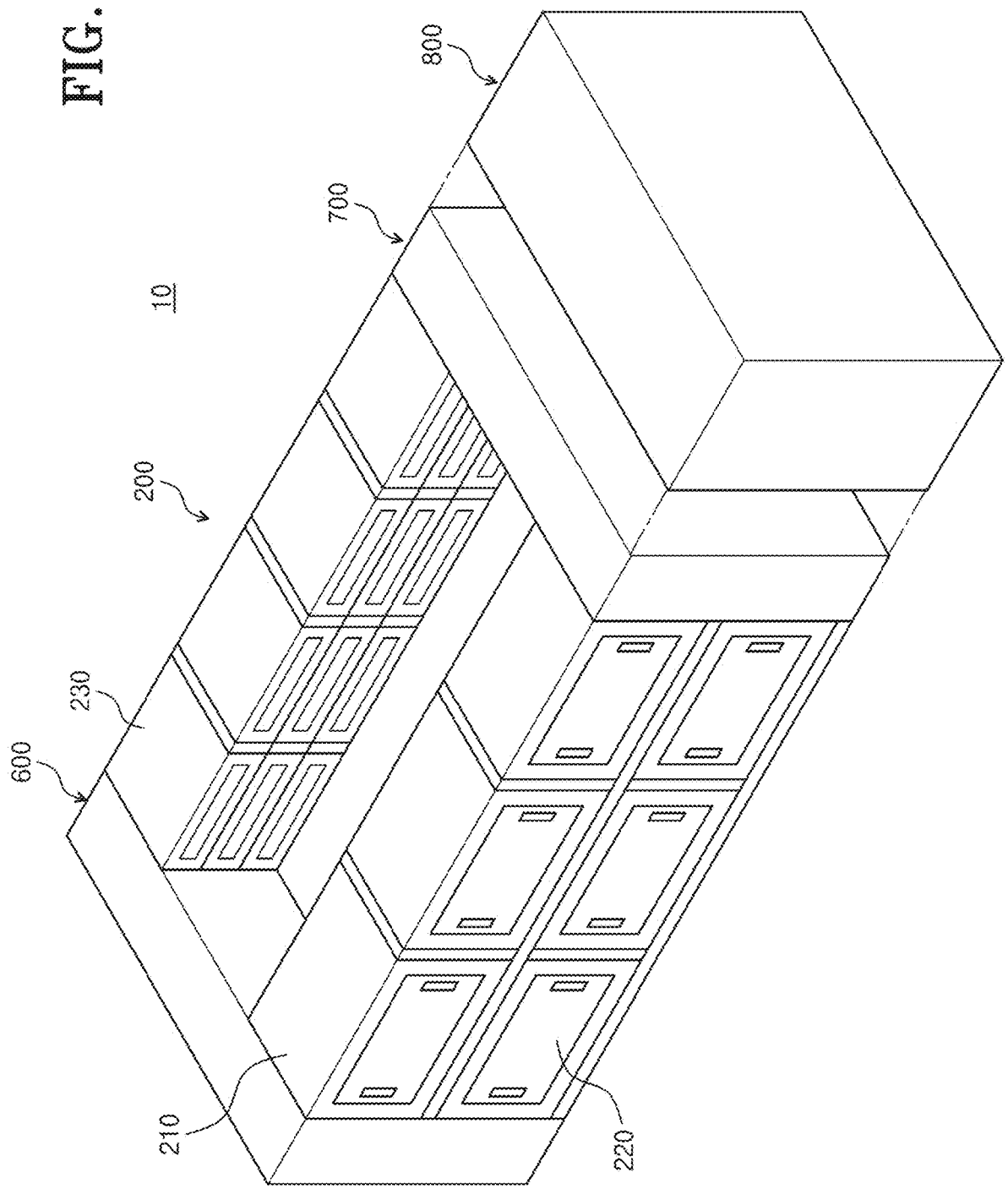
FIG. 1 is a perspective view of semiconductor manufacturing equipment including a substrate treating apparatus according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms such as first, second, and the like may be used to describe various components, but the components should not be limited by the terms. The terms may be used only for distinguishing one component from others. For example, without departing the scope of the inventive concept, a first component may be referred to as a second component, and similarly, the second component may also be referred to as the first component.

The terms of a singular form may include plural forms unless otherwise specified. Furthermore, in the drawings, the shapes and dimensions of components may be exaggerated for clarity of illustration.

In the entire specification, the terminology, component "~unit," refers to a software component or a hardware component such as an FPGA or an ASIC, and performs at least one function or operation. It should be, however, understood that the component "~unit" is not limited to a software or hardware component. The component "~unit" may be implemented in storage media that can be designated by addresses. The component "~unit" may also be configured to regenerate one or more processors.

For example, the component "~unit" may include various types of components (e.g., software components, object-oriented software components, class components, and task components), processes, functions, attributes, procedures, sub-routines, segments of program codes, drivers, firmware, micro-codes, circuit, data, data base, data structures, tables, arrays, and variables. Functions provided by a component and the component "~unit" may be separately performed by a plurality of components and components "~units" and may also be integrated with other additional components.

Hereinafter, embodiments of the inventive concept will be described in detail with reference to the accompanying drawings.

Figure 2:
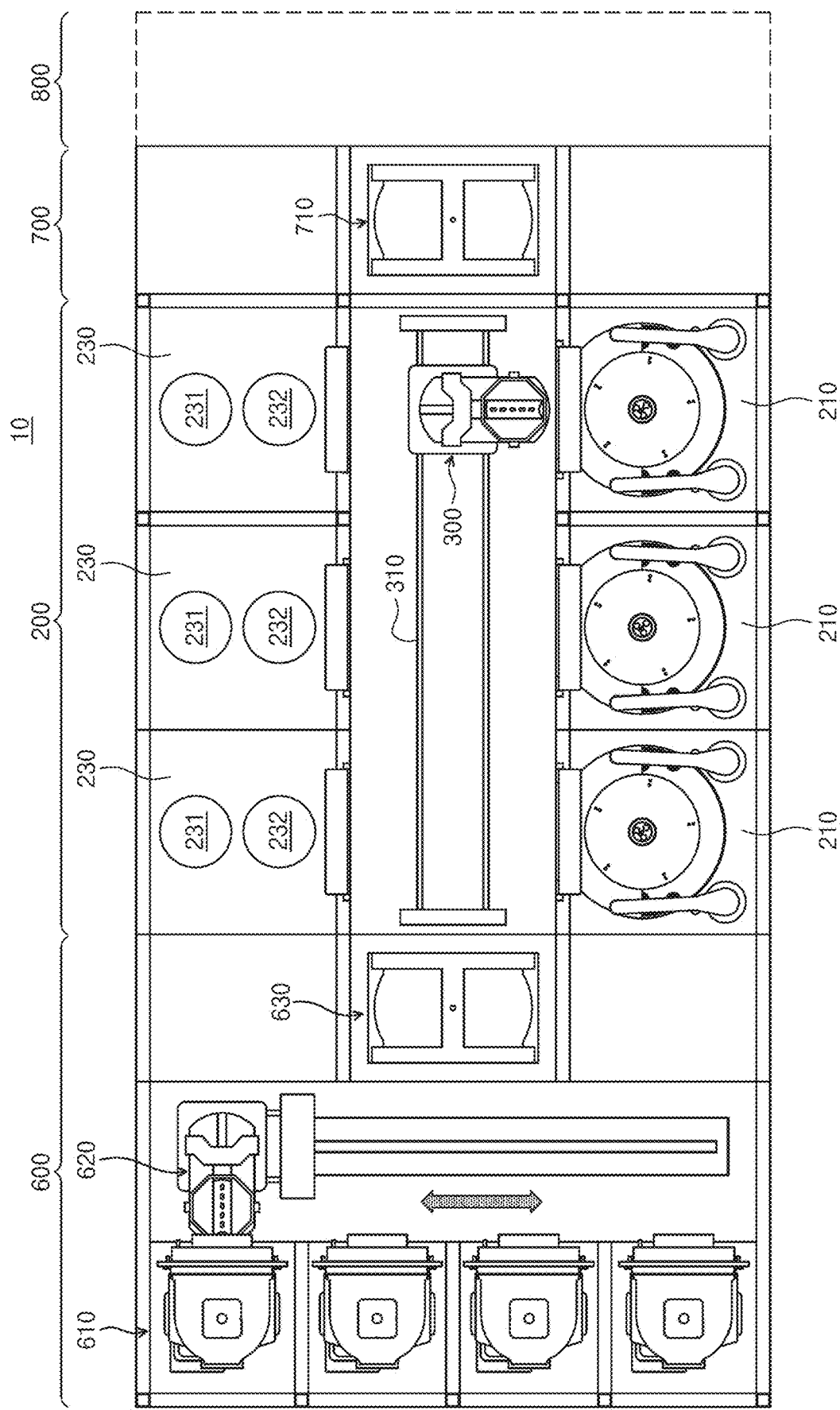
FIG. 2 is a plan view of the semiconductor manufacturing equipment illustrated in FIG. 1.

FIG. 1 is a perspective view of semiconductor manufacturing equipment 10 in which a substrate treating apparatus according to an embodiment of the inventive concept and a control method thereof are used. FIG. 2 is a plan view of the semiconductor manufacturing equipment 10 illustrated in FIG. 1. The semiconductor manufacturing equipment 10 to which the substrate treating apparatus according to the embodiment of the inventive concept and the control method thereof are applied will be described with reference to FIGS. 1 and 2 prior to description of a substrate treating apparatus according to another embodiment of the inventive concept and a control method thereof. The semiconductor manufacturing equipment 10 will be described as an example to help with comprehension of the inventive concept. However, it should be understood that the type of equipment to which the substrate treating apparatus according to the embodiment of the inventive concept and the control method thereof are applicable is not limited thereto.

Referring to FIGS. 1 and 2, the semiconductor manufacturing equipment 10 performs a photolithography process on substrates. The semiconductor manufacturing equipment 10 includes an index module 600, a process module 200, a substrate transfer module 700, and a stepper 800. The index module 600 includes a plurality of load ports 610, an index robot 620, and a first buffer 630. Substrates received in carriers placed on the load ports 610 are transferred to the first buffer 630 by the index robot 620. The index robot 620 moves along a transfer rail.

The process module 200 includes a plurality of process units 210, 220, and 230 that perform predetermined processes on the substrates.

The transfer robot 300 transfers the substrates between the first buffer 630 and the process units 210, 220, and 230 or between the process units 210, 220, and 230.

The plurality of units 210, 220, and 230 include the coating units 210 that perform a coating process of coating the substrates with a light-sensitive liquid such as photoresist, the developing units 220 that perform a developing process on the substrates subjected to an exposing process, and the bake units 230 that perform a bake process on the substrates.

The coating units 210 and the developing units 220 each have a spin head that supports and rotates a substrate and a nozzle that dispenses a chemical onto the substrate supported on the spin head. The developing units 220 may perform a developing process on the substrate by dispensing a developing solution onto the substrate supported on the spin head, and the coating units 210 may perform a coating process on the substrate by dispensing photoresist onto the substrate supported on the spin head.

Each of the bake units 230 includes a bake plate 231 and a cooling plate 232. The bake plate 231 heats the substrate, and the cooling plate 232 cools the substrate heated in the bake plate 231, to an appropriate temperature.

The transfer robot 300 receives the substrates from the first buffer 630 and transfers the substrates to the process units 210, 220, and 230 constituting the process module 200. The transfer robot 300 transfers the substrates along a loader 310. The substrate transfer module 700 includes a second buffer 710. The second buffer 710 transfers, to the stepper 800, the substrates having a photoresist film formed thereon by the coating units 210. The stepper 800 includes a plurality of exposing units (not illustrated) that perform an exposing process. The substrates completely exposed to light in the stepper 800 are transferred to the second buffer 710 again, and the substrates transferred to the second buffer 710 are sequentially transferred to the bake units 230 and the developing units 220 by the transfer robot 300.

As described above, the transfer robot 300 places the substrates in the process units 210, 220, and 230. The process units 210, 220, and 230 treat the substrates placed therein, based on process recipes for the substrates. The transfer robot 300 extracts the treated substrates from the process units 210, 220, and 230.

The substrate treating apparatus according to the other embodiment of the inventive concept may include a process module and a controller. The process module may include a plurality of process units that perform a plurality of steps of a substrate treating process. According to an embodiment, the process units may treat substrates sequentially placed therein, based on process recipes for the substrates.

As described above, the plurality of process units may include coating units, developing units, and bake units. However, the types of the process units are not limited thereto. Each of the process units may be one of units that can be included in various treating processes. The substrates may be sequentially placed in, or extracted from, the plurality of process units according to the sequence of the substrate treating process.

Figure 3:
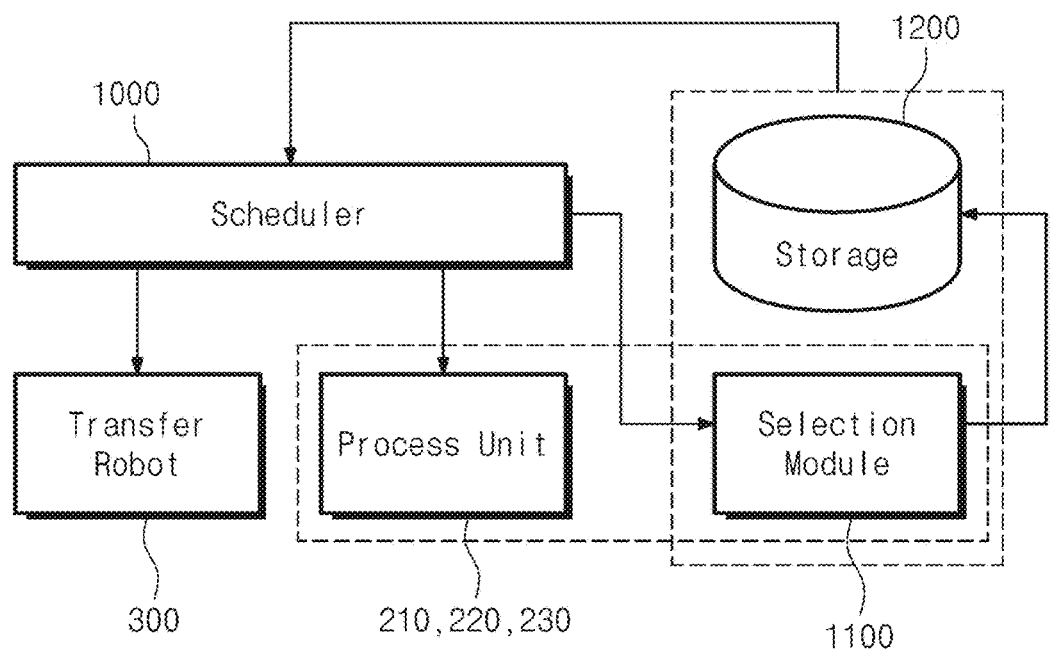
FIG. 3 is a block diagram of the substrate treating apparatus according to the embodiment of the inventive concept.

FIG. 3 is a schematic block diagram illustrating the substrate treating apparatus according to the embodiment of the inventive concept. Hereinafter, configurations and processes of a scheduler 1000, a selection module 1100, and storage 1200 will be described under the assumption that the process units 210, 220, and 230 included in the process module 200 perform processes as described above.

Referring to FIG. 3, the substrate treating apparatus may include the transfer robot 300, the process units 210, 220, and 230, the scheduler 1000, the selection module 1100, and the storage 1200. As described above, substrates are placed in, or extracted from, the process units 210, 220, and 230 by the transfer robot 300 in order to perform a substrate treating process.

The scheduler 1000 may control operations of the process units 210, 220, and 230 and the transfer robot 300 that are included in the process module 200. The scheduler 1000 may control which of the substrates is transferred by the transfer robot 300 when the substrates are treated according to process recipes. The scheduler 1000 may control which of the process units 210, 220, and 230 treat a substrate selected by the transfer robot 300. The scheduler 1000 may control an overall process.

The storage 1200 may store transfer paths along which the substrates are transferred. The storage 1200 may observe through which the process units 210, 220, and 230 the substrate treating process is completed, and may store the paths of the process units included in the transfer paths along which the substrates are transferred.

The substrate treating apparatus may further include a measuring instrument (not illustrated) that measures a defect value. The measuring instrument may make predetermined measurements for the substrates. The measuring instrument may make various measurements, for example, a particle measurement for the substrates before or after the substrate treating process. The measuring instrument may measure the degree of dust or particles affecting the qualities of the substrates. Furthermore, the measuring instrument may measure the degree of edge bead removal (EBR). The measuring instrument may measure the coating thicknesses of the substrates. Factors measured by the measuring instrument are not limited to those described above, and the measuring instrument may measure the degree of change in factors related to the performances of the substrates, in addition to the measurement factors described above.

When the storage 1200 measures defect values, this may mean that the states of the substrates after the substrates pass through specified paths are expressed as numerical values measured by the measuring instrument.

Based on the results stored in the storage 1200, the selection module 1100 may allow the scheduler 1000 to select a process unit to be selected in the next process. The selection module 1100 may apply weighting values to the process units included in the transfer paths, based on the transfer paths of the substrates stored in the storage 1200 and the measurement values measured along the transfer paths. The selection module 1100 may select the process unit having the highest score as a process unit to proceed, by a combination of the priorities of the process units having the weighting values applied thereto.

The selection module 1100 and the storage 1200 may be linked to each other to feed back, to the scheduler 1000, the results of the process units to which the stored transfer paths and the weighting values are applied. The scheduler 1000 may control the transfer robot 300 or the process units 210, 220, and 230 by using the results fed back from the selection module 1100 and the storage 1200.

Hereinafter, based on the descriptions of the components, embodiments will be described with reference to the accompanying drawings.

Figure 4:
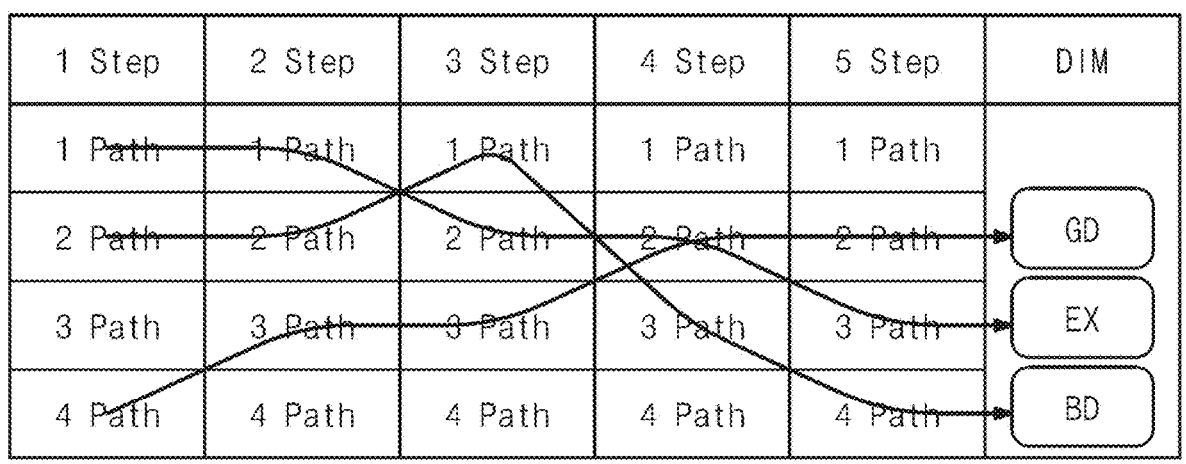
FIG. 4 is a view illustrating a method of obtaining a measurement value through a transfer path of a wafer according to an embodiment of the inventive concept.

FIG. 4 is a view illustrating a method of selecting a process unit according to the inventive concept. In FIG. 4, DIM denotes a measuring instrument. The paths illustrated in FIG. 4 represent transfer paths of substrates. Transfer paths of a total of three substrates are exemplified in FIG. 4. Each of the substrates may be treated through five steps. Furthermore, it is assumed that the number of process units selectable for each step is four. Paths selectable for respective steps are represented as follows. Path 1 in step 1 is represented by 1A, path 2 in step 1 is represented by 1B, path 1 in step 3 is represented by 3A, and path 4 in step 4 is represented by 4D.

The transfer paths of the substrates are represented as follows by using the aforementioned method.

The first substrate is treated along the transfer path 1A-2A-3B-4B-5C. The second substrate is treated along the transfer path 1B-2B-3A-4C-5D. The third substrate is treated along the transfer path 1D-2C-3C-4B-5B.

That is, the substrates are treated while passing through various process units. In this process, the substrates may pass through the same process unit 4B as described above, or may pass through different process units.

The measuring instrument DIM disposed at the ends of the transfer paths of the substrates measures defect values generated according to the paths along which the substrates are transferred. In the case where the measuring instrument DIM measures particles, the defect values may be the number of particles generated according to the paths along which the substrates are transferred.

The storage 1200 stores the defect values measured along the transfer paths of the substrates together with the transfer paths of the substrates.

That is, the storage 1200 may store which of the process units are used to treat the substrates and how the defect values are changed with the passage of the substrates through the corresponding process units.

According to an embodiment of the inventive concept, the storage 1200 may simulate all paths of the process units along which the substrates are transferred, and may store the result values. In the case of simulating all the paths of the process units, it is possible to know which process unit should not be selected.

Referring to FIG. 4, when all the paths along which the substrates are transferred are simulated, if substrates treated along a path including the process unit 4C as an intermediate path have significantly bad defect results, it can be seen that the process unit 4C is correspondingly excluded in determining priorities.

The storage 1200 may simulate all the paths along which the substrates are transferred during processing and may store defect measurement values according to the corresponding paths.

The selection module 1100 may assign weighting values to the process units by using the transfer paths and the defect values that are stored in the storage 1200.

For example, it is assumed that the states of the substrates after completion of a process are scored on a scale ranging from 1 to 10. It is assumed that 8 to 10 points are expressed as "Excellent", 5 to 7 points are expressed as "Good", and 0 to 4 points are expressed as "Bad". That is, the storage 1200 may score the states of the substrates, based on the defect values measured according to the transfer paths of the substrates. The storage 1200 may designate grades by scoring the states of the substrates and determining whether the corresponding points are within a preset reference range.

According to an embodiment of the inventive concept, the storage 1200 may directly designate grades based on the measured defect values, without separately carrying out the step of scoring the states of the substrates.

After the designation of the grades, a weighting value of +2 is assigned to the process units included in the transfer path with the grade "Excellent". A weighting value of +1 is assigned to the process units included in the transfer path with the grade "Good". No weighting value is assigned to the process units included in the transfer path with the grade "Bad".

The above description is merely illustrative, and the assigned weighting values and the designated grades may be changed by a user's setting without any specific limitation. An important aspect is that the selection module 1100 assigns the weighting values to the process units included in the paths having the high grades according the defect results generated depending on the paths and considers the weighting values when selecting the corresponding process units. Based on the aspect, there may be a difference between detailed embodiments.

As described above, the selection module 1100 may assign the weighting values to the process units included in the paths having the high grades and may feed the corresponding results back to the scheduler 1000, thereby allowing a process unit with a high weighting value to be preferentially selected when the next process unit is selected, which in turn enables efficient processing.

Additional description will be given with reference to FIG. 4. It can be seen that the transfer path of the first substrate has the grade "Excellent", the transfer path of the second substrate has the grade "Bad", and the transfer path of the third substrate has the grade "Good". That is, the process units included in the transfer path of the first substrate may have a higher priority, whereas the process units included in the transfer path of the second substrate may have a lower priority. Accordingly, in the case of simulating and comparing all cases, defect values may be measured for the respective process units, and therefore a process unit may be accurately and efficiently selected. However, even in the case where simulation is not sufficiently performed for reason of time economy, weighting values may be assigned depending on result values for some cases if the substrates are transferred along the corresponding path, and therefore a process unit to be selected in the next process may be efficiently selected.

The selection module 1100 may determine which of the process units has to be most preferentially selected, by comparing the process units to which the weighting values are applied.

For example, it is assumed that the selection module 1100 determines which of the process units has to be selected in step 3. Referring to FIG. 4, it can be seen that selectable paths in step 3 are 3A, 3B, 3C, and 3D.

To determine which of the process units has to be selected in step 3, a path through which a substrate passes in step 3 may be set to 3A, 3B, 3C, or 3D, and paths through which the substrate passes in the remaining steps 1, 2, 4, and 5 may be the same. In this case, the remaining conditions are the same, but there is a difference only in the process unit through which the substrate passes in step 3. When the substrate passes through 3A, 3B, 3C, or 3D, which is a process unit included in step 3, a defect value according to each path may be discerned, and the defect result value may vary depending on the process unit in step 3 because the transfer paths of the substrate in the remaining steps other than step 3 are the same. That is, a process unit that indicates the most excellent defect value according to the result among 3A, 3B, 3C, and 3D may be selected to be a process unit having the highest priority in step 3.

A method of selecting a process unit having a high priority is not limited to the above-described method. The process unit may be selected based on only the process units themselves as described above, but due to the nature of the process, a defect measurement value may vary depending on the path along which the process is performed in the same process unit. That is, the result value may be affected by the path along which a substrate is moved. Therefore, a method of selecting a process unit having a high priority may be simulated in various ways and may be selected by comparing the simulation results.

Figure 5:
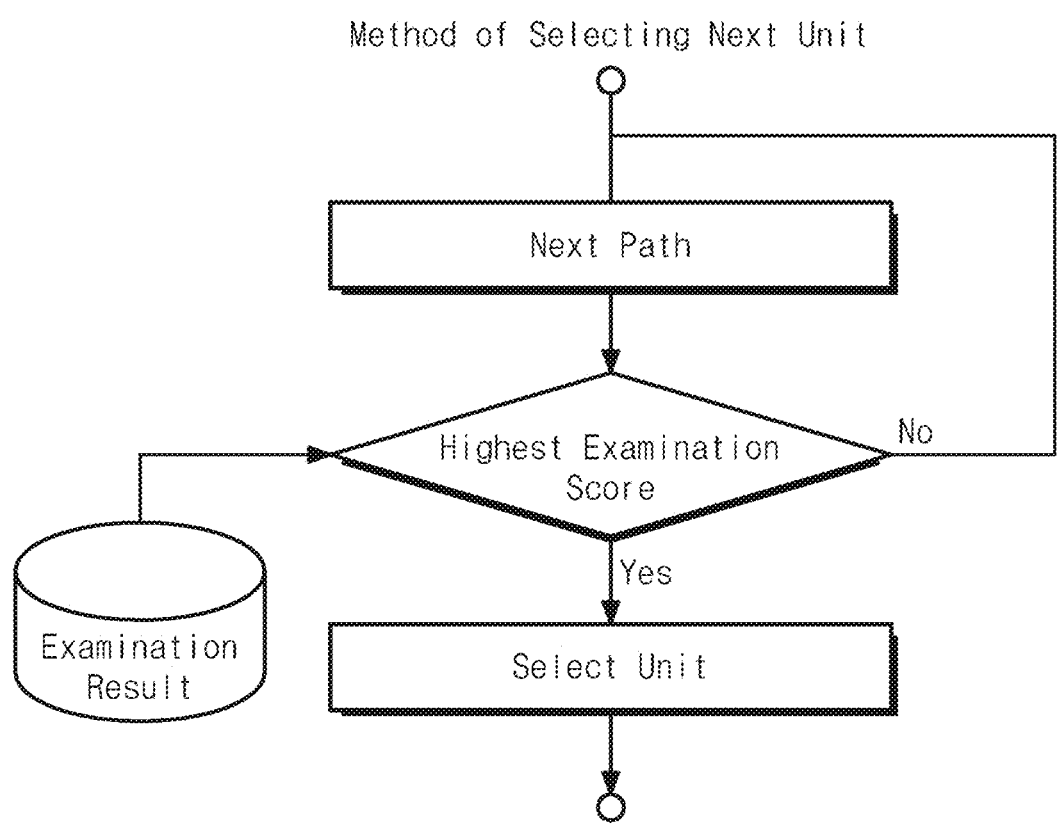
FIG. 5 is a flowchart illustrating a method of selecting a process unit according to an embodiment of the inventive concept.

FIG. 5 is a flowchart illustrating a method of selecting the next process unit.

Referring to FIG. 5, a process of selecting the next path is disclosed. The next process unit may be selected based on examination results stored in the storage 1200 and the selection module 1100. The examination results may include transfer paths of substrates and defect values according to the transfer paths that are stored in the storage 1200, and information about process units to which weighting values are assigned. Furthermore, the examination results may include information regarding results obtained by designating priorities by scoring the process units. The process unit having the highest examination score among the process units placed on the next path may be selected based on the information included in the examination results. The highest examination score means the highest of the weighting values assigned to among the process units placed on the next path. That is, the process unit having the highest weighting value assigned thereto, among the process units placed on the next path, may be preferentially selected.

FIG. 5 is a schematic view illustrating a mechanism for selecting a process unit. Hereinafter, a process of actually selecting a process unit will be described in detail.

It is assumed that the transfer robot 300 is located in a position to select a process unit from which a substrate is picked (that is, extracted). Prior to selection of a process unit, whether a substrate is present in the corresponding process unit among target process units is determined. When it is determined that the substrate is present in the corresponding process unit, whether a substrate treating process is completely performed in the corresponding process unit is determined. When it is determined that the substrate treating process is completely performed in the corresponding process unit, whether the corresponding substrate corresponds to the foremost job is determined. When the conditions are all satisfied, the process unit having the highest priority is selected from the process units that satisfy all of the conditions.

In another embodiment, it is assumed that the transfer robot 300 is located in a position to select a process unit in which a substrate is placed. Prior to selection of a process unit, whether there is no substrate in the corresponding process unit among target process units is determined. When it is determined that the corresponding process unit has no substrate therein, whether an environment for performing a process of the corresponding process unit is set is determined. When the conditions are all satisfied, the process unit having the highest priority is selected from the process units that satisfy all of the conditions.

In another embodiment, it is assumed that the transfer robot 300 is located in a position to select a process unit from which a substrate is immediately picked and in which a substrate is immediately placed thereafter. Prior to selection of a process unit, whether a process of a substrate present in the corresponding process unit is completed is determined. When it is determined that the process is completed, whether lot overtaking occurs even though the existing substrate is replaced with the next substrate is determined. Thereafter, whether an environment for performing a process of the corresponding process unit is set when the substrate is placed in the corresponding process unit is determined. When the conditions are all satisfied, the process unit having the highest priority is selected from the process units that satisfy all of the conditions, and a process is performed by the corresponding process unit.

Figure 6:
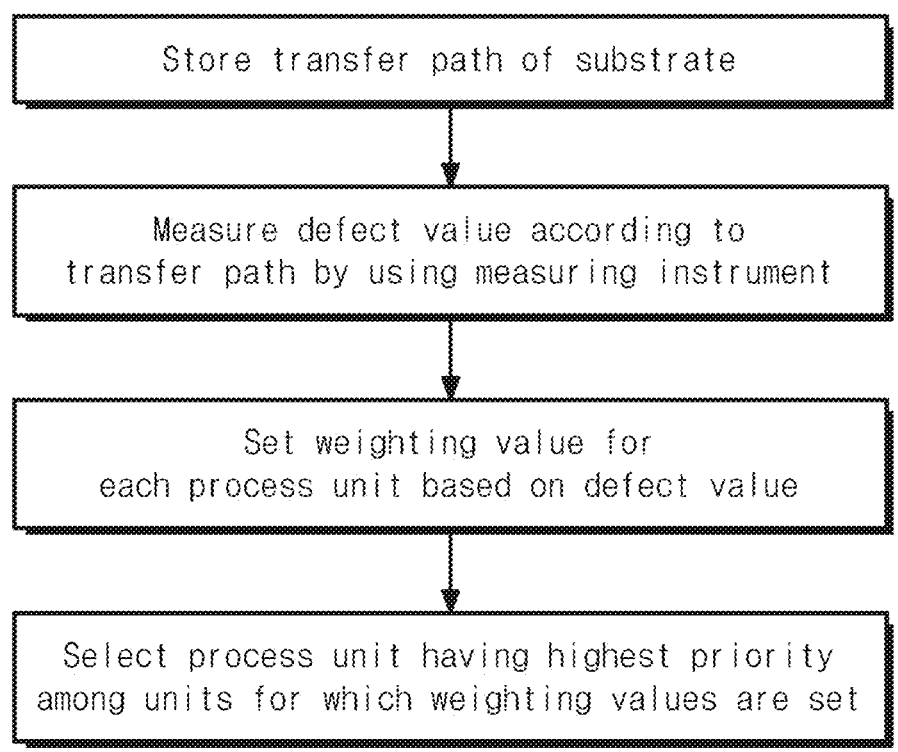
FIG. 6 is a flowchart illustrating a substrate treating method according to the inventive concept.

FIG. 6 is a flowchart illustrating a method of selecting a process unit in a substrate treating method according to an embodiment of the inventive concept.

Referring to FIG. 6, the method of selecting the process unit in the inventive concept includes a step of storing transfer paths of substrates. In this step, information regarding process units through which the substrates pass is stored. The stored information may be information about the process units. Furthermore, the stored information may be information about the sequence of the process units. In the next step, defect values according to the transfer paths of the substrates may be measured by the measuring instrument. The measuring instrument may be located in the last step of a substrate treating process. Alternatively, the measuring instrument may be located in the start and last steps of the substrate treating process. When the measuring instrument is located in only the last step of the substrate treating process, the defect values are measured without a value to be compared. According to an embodiment, when the measuring instrument is located in the start and last steps of the substrate treating process, defect values before the process and defect values after the corresponding path may be compared and stored. Therefore, the process may be more efficiently performed, and the accuracy in measuring result values may be improved.

In regard to the installation position of the measuring instrument, the measuring instrument is actually located in the last step of the substrate treating process in most cases in consideration of output, and no measuring instrument may be set. If actual wafer production is not considered, the measuring instrument may be installed before and after the process, and therefore an efficient transfer path may be achieved.

By using the process unit selection method described above, an abnormal unit or an abnormal transfer path in the equipment may be easily determined. Furthermore, the abnormal unit or the abnormal transfer path may be stored in the storage 1200, and the corresponding result may be fed back to the scheduler 1000. Accordingly, the result may be used to select a process unit to proceed.

According to the embodiments of the inventive concept, the substrate treating apparatus and method may improve a process result by feeding back a path along which a wafer is transferred in the substrate treating apparatus including the plurality of process units.

Furthermore, according to the embodiments of the inventive concept, the substrate treating apparatus and method may automatically select an efficient process unit.

Effects of the inventive concept are not limited to the above-described effects. Any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. The drawings provided in the inventive concept are only drawings of the optimal embodiments of the inventive concept. The scope of the inventive concept should be determined by the technical idea of the claims, and it should be understood that the scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:
1. A substrate treating apparatus comprising:
a process module including a plurality of process units configured to perform a plurality of steps included in a substrate treating process, wherein the process units perform the substrate treating process on substrates sequentially placed in the process units, based on process recipes for the substrates;
a scheduler configured to control operations of the process module and the process units included in the process module;
a storage configured to store transfer paths information of the substrates, the transfer paths information including transfer paths of the substrates and defect values of the substrates according to the transfer paths of the substrates;
a selection module configured to apply weighting values to the process units included in the transfer paths stored in the transfer paths information, and to select a process unit to proceed, based on a result of feeding back the transfer paths information stored in the storage to the scheduler; and
a measuring instrument configured to measure the defect values of the transfer paths information along which the substrates are transferred, wherein the weighting values include numerical indicators of the process units' condition and are based on the transfer paths and the defect values of the substrates,
wherein the selecting the process unit to proceed includes determining a priority of the process units based on a comparison of the weighting values of the process units,
wherein the selection module determines the priority based on a result obtained by applying the weighting values and selects a process unit having the highest priority,
wherein the process module further including a transport robot configured to transfer the substrate,
wherein the scheduler is configured to control the transport robot as follows,
(a) when the transport robot is in a position to select a process unit from which the substrate is picked:
prior to selection of a process unit, determine whether a substrate is present in the corresponding process unit among target process units;
when it is determined that the substrate is present in the corresponding process unit, determine whether a substrate treating process is completely performed in the corresponding process unit;
when it is determined that the substrate treating process is completely performed in the corresponding process unit, determine whether the corresponding substrate corresponds to a foremost job; and
when the conditions are all satisfied, select the process unit having the highest priority from the process units that satisfy all of the conditions,
(b) when the transport robot is in a position to select a process unit from which the substrate is placed:
prior to selection of a process unit, determine whether there is no substrate in the corresponding process unit among target process units;
when it is determined that the corresponding process unit has no substrate therein, determine whether an environment for performing a process of the corresponding process unit is set; and
when the conditions are all satisfied, select the process unit having the highest priority from the process units that satisfy all of the conditions,
(c) when the transport robot is in a position to select a process unit from which the substrate is pick and placed:
prior to selection of a process unit, determine whether a process of a substrate present in the corresponding process unit is completed;
when it is determined that the process is completed, determine whether lot overtaking occurs even though an existing substrate is replaced with a subsequent substrate;
determine whether an environment for performing a process of the corresponding process unit is set when the substrate is placed in the corresponding process unit; and
when the conditions are all satisfied, select the process unit having the highest priority from the process units that satisfy all of the conditions, and a process is performed by the corresponding process unit.

2. The substrate treating apparatus of claim 1, wherein the storage stores simulation result of all paths along which the substrates are capable of proceeding and further stores defect values measured according to all the paths simulated.

3. A substrate treating method comprising:
performing a process, by process units, on substrates inserted into the process units, respectively, based on process recipes for the substrates; and
controlling, by a scheduler, the process,
measuring defect values according to transfer paths of the processed substrates by using a measuring instrument on the substrates;
storing, in a database, the transfer paths with the corresponding defect values as transfer paths information;
determining a priority based on a result of the measuring;
selecting a process unit having the highest priority among the process units; and,
transferring, the substrate by a transport robot,
wherein the scheduler selects a process unit in which a subsequent process is to be performed, by a result of performing feedback based on the database in which the transfer paths information of the substrates are stored,
wherein the determining the priority based on the result of the measuring includes
applying weighting values to the process units, based on the measured defect values, and
determining the priority based on a comparison of the weighting values of the process units, and
wherein the weighting values include numerical indicators of the process units' condition based on the transfer paths and the defect values of the substrates,
wherein the scheduler controls the transport robot as follows,
(a) when the transport robot is in a position to select a process unit from which the substrate is picked:
prior to selection of a process unit, determine whether a substrate is present in the corresponding process unit among target process units;
when it is determined that the substrate is present in the corresponding process unit, determine whether a substrate treating process is completely performed in the corresponding process unit;
when it is determined that the substrate treating process is completely performed in the corresponding process unit, determine whether the corresponding substrate corresponds to a foremost job; and
when the conditions are all satisfied, select the process unit having the highest priority from the process units that satisfy all of the conditions,
(b) when the transport robot is in a position to select a process unit from which the substrate is placed:
prior to selection of a process unit, determine whether there is no substrate in the corresponding process unit among target process units;
when it is determined that the corresponding process unit has no substrate therein, determine whether an environment for performing a process of the corresponding process unit is set; and
when the conditions are all satisfied, select the process unit having the highest priority from the process units that satisfy all of the conditions,
(c) when the transport robot is in a position to select a process unit from which the substrate is pick and placed:
prior to selection of a process unit, determine whether a process of a substrate present in the corresponding process unit is completed;

when it is determined that the process is completed, determine whether lot overtaking occurs even though an existing substrate is replaced with a subsequent substrate;

determine whether an environment for performing a process of the corresponding process unit is set when the substrate is placed in the corresponding process unit; and when the conditions are all satisfied, select the process unit having the highest priority from the process units that satisfy all of the conditions, and a process is performed by the corresponding process unit.

4. The substrate treating method of claim 3, further comprising:

storing the transfer paths information of the substrates.

5. The substrate treating method of claim 4, wherein the storing of the transfer paths of the substrates further includes:

storing all paths along which the substrates are capable of proceeding.

6. The substrate treating method of claim 4, wherein the measuring of the defect values includes:

measuring the defect values by using the measuring instrument installed before and after the substrate treating process.

7. The substrate treating apparatus of claim 1, wherein the weighting values are based on grades of the substrates; and the grades are based on the defect values of the substrates after the substrates have been treated based on the process recipes.

8. The substrate treating apparatus of claim 1, wherein the selecting the process unit to proceed includes selecting one of the process units to which the weighting values are applied.

9. The substrate treating apparatus of claim 1, wherein the process unit having the highest priority is an available process unit with a greatest total weighting value.

* * * * *